US009508928B2

(12) United States Patent
Wang et al.

(10) Patent No.: US 9,508,928 B2
(45) Date of Patent: Nov. 29, 2016

(54) NANOCHANNEL ARRAY OF NANOWIRES FOR RESISTIVE MEMORY DEVICES

(71) Applicant: Hewlett-Packard Development Company, L.P., Houston, TX (US)

(72) Inventors: Shih-Yuan Wang, Palo Alto, CA (US); Jianhua Yang, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 14/784,482

(22) PCT Filed: May 15, 2013

(86) PCT No.: PCT/US2013/041069
§ 371 (c)(1),
(2) Date: Oct. 14, 2015

(87) PCT Pub. No.: WO2014/185897
PCT Pub. Date: Nov. 20, 2014

(65) Prior Publication Data
US 2016/0056377 A1   Feb. 25, 2016

(51) Int. Cl.
*H01L 45/00* (2006.01)
*H01L 27/24* (2006.01)

(52) U.S. Cl.
CPC ....... *H01L 45/1233* (2013.01); *H01L 27/2463* (2013.01); *H01L 45/08* (2013.01); *H01L 45/141* (2013.01); *H01L 45/142* (2013.01); *H01L 45/143* (2013.01); *H01L 45/144* (2013.01); *H01L 45/145* (2013.01); *H01L 45/146* (2013.01); *H01L 45/148* (2013.01); *H01L 45/149* (2013.01); *H01L 45/1608* (2013.01)

(58) Field of Classification Search
None
See application file for complete search history.

(56) References Cited

U.S. PATENT DOCUMENTS

| | | | |
|---|---|---|---|
| 7,749,801 B2 | 7/2010 | Choi et al. | |
| 8,278,642 B2 | 10/2012 | Yoo et al. | |
| 2006/0263289 A1 | 11/2006 | Heo et al. | |
| 2008/0093589 A1* | 4/2008 | Liu | H01L 45/085 257/3 |
| 2008/0296551 A1* | 12/2008 | Nihei | H01L 27/101 257/2 |
| 2009/0003040 A1* | 1/2009 | Stan | B82Y 10/00 365/151 |
| 2010/0270528 A1* | 10/2010 | Yoo | B82Y 10/00 257/3 |
| 2012/0132880 A1* | 5/2012 | Bratkovski | G11C 13/0007 257/3 |

(Continued)

FOREIGN PATENT DOCUMENTS

| | | |
|---|---|---|
| KR | 10-20090126676 | 12/2009 |
| KR | 10-20100032572 | 3/2010 |
| WO | WO-2012067667 | 5/2012 |

OTHER PUBLICATIONS

Sacchetto, D., P. Gaillardon, M. Zervas, S. Carrara, G. De Micheli, and Y. Leblebici. "Applications of Multi-Terminal Memristive Devices: A Review." IEEE Circuits Syst. Mag. IEEE Circuits and Systems Magazine 13.2 (2013): 23-41.*

(Continued)

*Primary Examiner* — Joseph Schoenholtz
(74) *Attorney, Agent, or Firm* — Hewlett Packard Enterprise Development LP

(57) ABSTRACT

A resistive memory structure includes two electrodes sandwiching an insulating region. The structure further includes a nanochannel array providing a conducting path between the two electrodes. The nanochannel array includes a plurality of nanowires that extends from one electrode to the other.

19 Claims, 5 Drawing Sheets

(56) References Cited

U.S. PATENT DOCUMENTS

2012/0235112 A1* 9/2012 Huo .................. H01L 45/085
257/4
2015/0311461 A1* 10/2015 Cola .................. H01L 51/0048
136/259

OTHER PUBLICATIONS

Dong, Yajie, Guihua Yu, Michael C. Mcalpine, Wei Lu, and Charles M. Lieber. "Si/a-Si Core/Shell Nanowires as Nonvolatile Crossbar Switches." Nano Letters Nano Lett. 8.2 (2008): 386-91.*
Definition of 'Extend' downloaded from URL<http://www.merriam-webster.com/dictionary/extend on May 20, 2016.*
Definition of 'Contiguous' downloaded from URL< http://www.merriam-webster.com/dictionary/contiguous> on May 20, 2016.*
Andreasson, B.P., et al., "Spatial distribution of oxygen vacancies in Cr-doped SrTiO3 during an electric-field-driven insulator-to-metal transition," (2009) Applied Physics Letters, vol. 94, 4 Pages.
International Searching Authority, The International Search Report and the Written Opinion, Feb. 26, 2014. 16 Pages.
Johnson, S. L., et al. "Memristive switching of single-component metallic nanowires," Nanotechnology 21.12 (2010): 125204, 6 Pages.
Sawa, A., "Resistive switching in transition metal oxides," Materials Today, pp. 28-36, Jun. 28, 2008 | vol. 11 | No. 6.
Song, Jinhui, et al. "Polar Charges Induced Electric Hysteresis of ZnO Nano/Microwire for Fast Data Storage," Nano letters 11.7 (2011): 2829-2834.

* cited by examiner

NANOCHANNEL ARRAY OF NANOWIRES FOR RESISTIVE MEMORY DEVICES

BACKGROUND

Resistive memory elements can be programmed to different resistive states by applying programming energy. After programming, the state of the resistive memory elements can be read and remains stable over a specified time period. Large arrays of resistive memory elements can be used to create a variety of resistive memory devices, including non-volatile solid state memory, programmable logic, signal processing, control systems, pattern recognition devices, and other applications. Examples of resistive memory devices include memristors, phase change memory, and spin-transfer torque.

Memristors are devices that can be programmed to different resistive states by applying a programming energy, for example, a voltage or current pulse. This energy generates a combination of electric field and thermal effects that can modulate the conductivity of both non-volatile switch and non-linear select functions in a memristive element. After programming, the state of the memristor can be read and remains stable over a specified time period. Memristive elements can be used in a variety of applications, including non-volatile solid state memory, programmable logic, signal processing, control systems, pattern recognition, and other applications.

DETAILED DESCRIPTION

Figure 1:
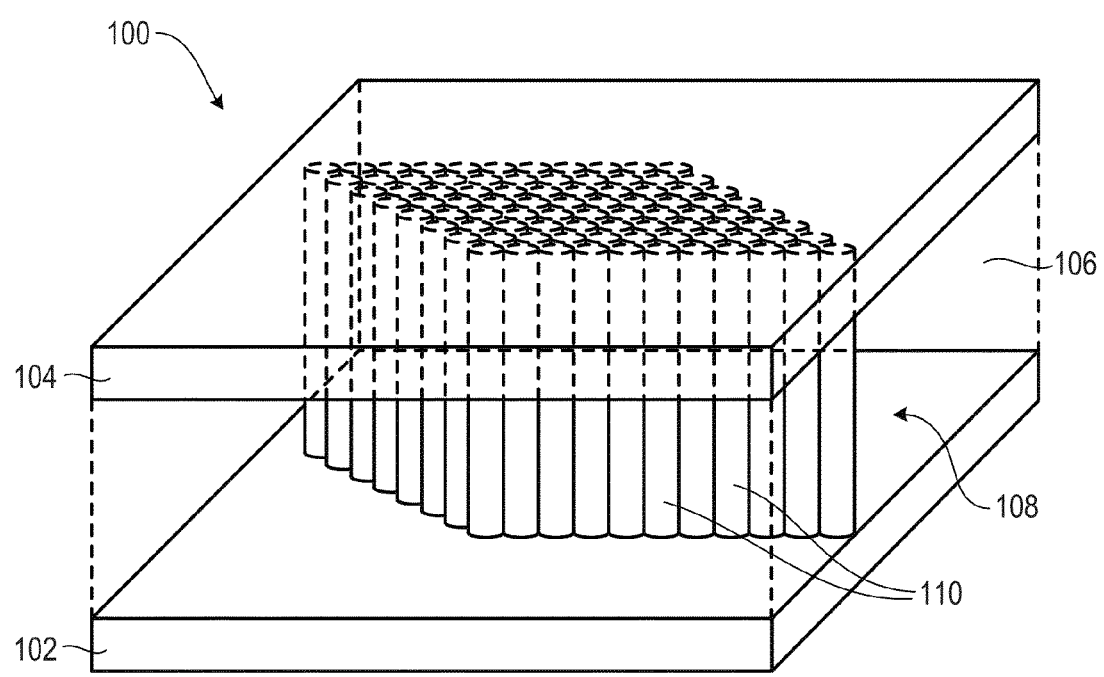
FIG. 1 is a schematic drawing in perspective, illustrating a plurality of nanochannels in a memory device, such as a memristive device, according to an example.

As used in the specification and claims herein, the singular forms "a," "an," and "the" include plural referents unless the context clearly dictates otherwise.

As used in this specification and the appended claims, "approximately" and "about" mean a ±10% variance caused by, for example, variations in manufacturing processes.

In the following detailed description, reference is made to the drawings accompanying this disclosure, which illustrate specific examples in which this disclosure may be practiced. The components of the examples can be positioned in a number of different orientations and any directional terminology used in relation to the orientation of the components is used for purposes of illustration and is in no way limiting. Directional terminology includes words such as "top," "bottom," "front," "back," "leading," "trailing," etc.

It is to be understood that other examples in which this disclosure may be practiced exist, and structural or logical changes may be made without departing from the scope of the present disclosure. Therefore, the following detailed description is not to be taken in a limiting sense. Instead, the scope of the present disclosure is defined by the appended claims.

Resistive memory elements can be used in a variety of applications, including non-volatile solid state memory, programmable logic, signal processing, control systems, pattern recognition, and other applications.

As used in the specification and appended claims, the term "resistive memory elements" refers broadly to programmable non-volatile resistors such as resistive random access memory (ReRAM), phase change memory (PCRAM), memristor technology based on perovskites (such as $Sr(Zr)TiO_3$), transition metal oxides (such as NiO or $TiO_2$ or $TaO_x$), chalcogenides (such as $Ge_2Sb_2Te_5$ or AgInSbTe), solid-state electrolytes (such as GeS, GeSe, $Cu_2S$), organic charge transfer complexes (such as CuTCNQ), organic donor-acceptor systems, various molecular systems, or other non-volatile programmable resistive memory elements.

Memristors, or memristive devices, are nano-scale devices that may be used as a component in a wide range of electronic circuits, such as memories, switches, and logic circuits and systems. In a memory structure, a crossbar of memristors may be used. For example, when used as a basis for memories, the memristor may be used to store a bit of information, 1 or 0, corresponding to whether the memristor is in its high or low resistance state (or vice versa). When used as a logic circuit, the memristor may be employed as configuration bits and switches in a logic circuit that resembles a Field Programmable Gate Array, or may be the basis for a wired-logic Programmable Logic Array. It is also possible to use memristors capable of multi-state or analog behavior for these and other applications.

When used as a switch, the memristor may either be in a low resistance (closed) or high resistance (open) state in a cross-point memory. During the last few years, researchers have made great progress in finding ways to make the switching function of these memristors behave efficiently. For example, tantalum oxide ($TaO_x$)-based memristors have been demonstrated to have superior endurance over other nano-scale devices capable of electronic switching. In lab settings, tantalum oxide-based memristors are capable of over 10 billion switching cycles.

A memristor may comprise a switching material, such as $TiO_x$ or $TaO_x$, sandwiched between two electrodes. Memristive behavior is achieved by the movement of ionic species (e.g., oxygen ions or vacancies) within the switching material to create localized changes in conductivity via modulation of a conductive filament between two electrodes, which results in a low resistance "ON" state, a high resistance "OFF" state, or intermediate states. Initially, when the memristor is first fabricated, the entire switching material may be nonconductive. As such, a forming process may be required to form the conductive channel in the switching material between the two electrodes. A known forming process, often called "electroforming", includes applying a sufficiently high (threshold) voltage across the electrodes for a sufficient length of time to cause a nucleation and formation of a localized conductive channel (or active region) in the switching material. The threshold voltage and the length of time required for the forming process may depend upon the type of material used for the switching material, the first electrode, and the second electrode, and the device geometry.

Metal or semiconductor oxides may be employed in memristive devices; examples include either transition metal oxides, such as tantalum oxide, titanium oxide, yttrium oxide, hafnium oxide, niobium oxide, zirconium oxide, or other like oxides, or non-transition metal oxides, such as aluminum oxide, calcium oxide, magnesium oxide, dysprosium oxide, lanthanum oxide, silicon dioxide, or other like oxides. Further examples include transition metal nitrides, such as tantalum nitride and titanium nitride.

Prior art memristive devices may include a continuous oxide film between the electrodes. Filaments/ionic diffusion are formed in the oxide film between the electrodes in a random fashion, much like lightning, that may take the path of least resistance. This random path causes variations in the memristor I-V characteristics from switching cycle to cycle and especially from device to device. Prior art memristive or non-volatile resistive memory devices that are either unipolar or bipolar tend to have this random conductive path between the electrodes. This randomness in the conductive channel formation may cause reproducibility and/or reliability issues.

In accordance with the teachings herein, nanoscale channels may be used to establish a precise channel for the conductive path of both unipolar and bipolar memristive devices. Ions can diffuse in multiple channels but the length of the path between the electrodes is always approximately the same. In addition, if dense nanowires are used, then the ions can diffuse either in the nanowires or the surface of the nanowires, which can have a surface effect and allow ionic diffusion to be much faster.

By "dense nanowires" or "dense array of nanowires" is meant the packing density of the nanowires in the array. Consider a cross-sectional view of the array of nanowires. In some examples, the nanowires may be in a square configuration. In other examples, the nanowires may be in a triangular or honeycomb configuration. This latter configuration may be considered to be a close-packed configuration.

In any event, the nanowires may be touching adjacent nanowires to form packed or close-packed structures, in some examples. In other examples, the nanowires may be spaced apart from other nanowires by a distance up to the diameter of the nanowires in the array.

The size of the array may be from 10% of the memristive cell area up to 100% of the cell area. In some examples, the size of the array may be greater than 50% of the cell area. As an example, in a nominal 10×10 nm$^2$ memristive cell, an array may have 100×100 nanowires of 0.1 nm diameter each. The remaining area of the cell is taken up by the insulating region. The insulating region may comprise an oxide, such as $Ta_2O_5$, $TiO_2$, $Nb_2O_5$, or other transition metal oxide.

Notably, the size of the array in each cell does not need to be very uniform from one cell to the next, so long as there are enough nanochannels to provide the path for species movement in each cell.

An anisotropic oxide film may consist of a dense bundle of ionic/electron channels such that the filaments/ionic diffusion all have approximately the same distance from opposite electrodes. Since the electrodes in a memristive device may be spaced apart by about 10 nm, the length of the nanowires is approximately the same. The motion path of mobile species is defined to be approximately identical for different devices, which may significantly reduce the variability from device to device.

Thus, the presence of the nanoscale channels may remove the random nature of the formation of conducting path, either filamentary or ionic diffusion. Further, the nanoscale channels may provide a "highway" for ionic diffusion.

The channels may be made of dense nanowires, with diameters of less than one nanometer, for example, a diameter of 0.1 nm, to a few nanometers, for example, 2 nm. The ionic path can either be in the nanowires or on the surface of adjacent nanowires (between nanowires) depending on the electrical/chemical/physical properties of the nanowires. In particular, where the nanowires are touching in a packed or close-packed array, the interfaces between such a plurality of nanowires may result in improved ionic conductivity. Thus, beyond the redundancy that the plurality of nanowires offers, the improved conductivity along the interfaces may be superior to one, or even a few, nanowires in a given cell. With this reduced variability for the filament/ionic diffusion path, the I-V characteristics may be more reproducible. Since the channels are extremely anisotropic conductors, high field breakdown at edges are also significantly reduced.

FIG. 1 depicts a memristive device 100 in accordance with these teachings. The device 100 has two electrodes 102, 104 that sandwich an insulating region 106, shown here in phantom so as to more clearly depict an array 108 of the nanowires 110 making up the nanoscale channels.

Figure 2:
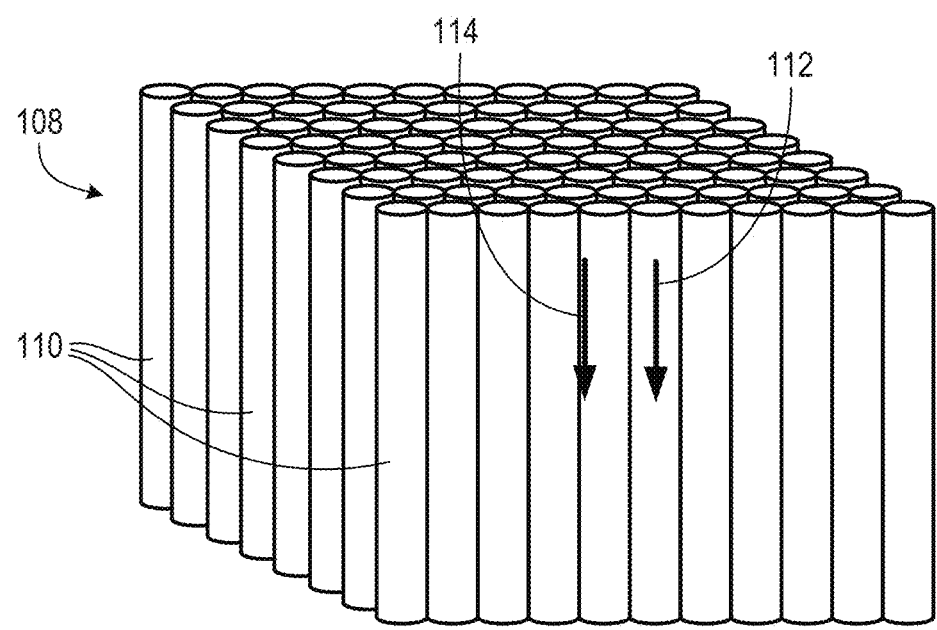
FIG. 2 is a similar drawing to FIG. 1, but eliminating the electrodes and insulating region for clarity, wherein examples of the ionic path between electrodes are shown.

FIG. 2 depicts the array 108 of nanowires 110 as shown in FIG. 1, but without the electrodes 102, 104 and the insulating region 106. The ionic path between the two electrodes may take one of two paths: in the nanowire 110, as shown by arrow 112, or in the interstitial region between nanowires, as shown by arrow 114. It appears that the interstitial path 114 may provide faster transport of the ionic species—up to 10 to 100 times faster than through the interior of the nanowire via path 112.

The materials of the nanowires 110 may be metal oxides, metal nitrides, metal carbides, chalcogenides, etc., or semiconductors, such as Si, Ge, etc. With regard to the metal oxides, particularly the transition metal oxides, deposition, such as by sputtering, may cause the formation of vacancies, thereby supporting ionic conduction. The same may also hold true for metal nitrides (nitrogen-rich nitrides), and metal carbides (carbon-rich carbides). For example, in the case of metal oxides, and transition metal oxides in particular, oxygen vacancies may be formed during deposition of the oxide. This may be the case whether the oxide is stoichiometric or non-stoichiometric, although there may be more oxygen vacancies in the non-stoichiometric condition. The same state of affairs may hold true for the metal nitrides and metal carbides as well.

The nanowires can also be in the form of core/shell nanowires. Either the core or the shell can be an electron or ion conducting path. For example, the nanowires can be Si nanowire cores with $SiO_2$ nanowire shells (formed by oxidizing Si nanowires, for instance). In this case, the ionic path may be through the core of the nanowire. Additional examples of core/shell nanowires may include III-V semiconductor cores surrounded by III-V nitride shells, such as GaAs cores and $GaAs_{1-x}N_x$ shells, where $0<x<1$.

Figure 3:
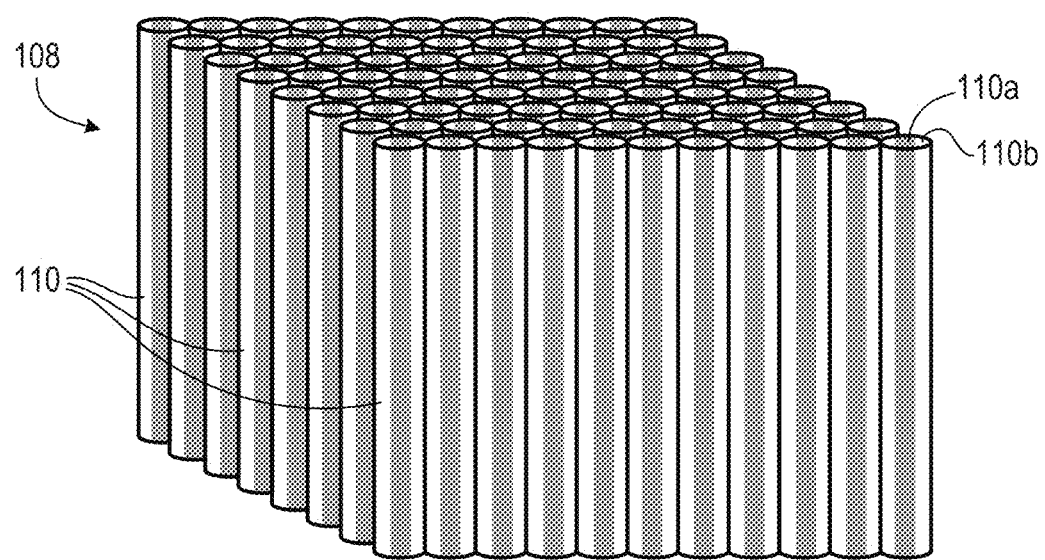
FIG. 3 is a similar drawing to FIG. 1, but eliminating the electrodes and insulating region for clarity, wherein an example of a core/shell nanowire structure is shown.

FIG. 3 depicts the array 108 of nanowires 110 as shown in FIG. 1, but without the electrodes 102, 104 and the insulating region 106. In this example, the wires 110 have a core 110a and a shell 110b surrounding the core.

In some examples, the core/shell structure may be obtained by providing nanowires 110 spaced apart, as described above. The nanowires 110 may then be processed, such as by atomic layer deposition (ALD) to form the shell 110b surrounding the core 110a.

Figure 4:
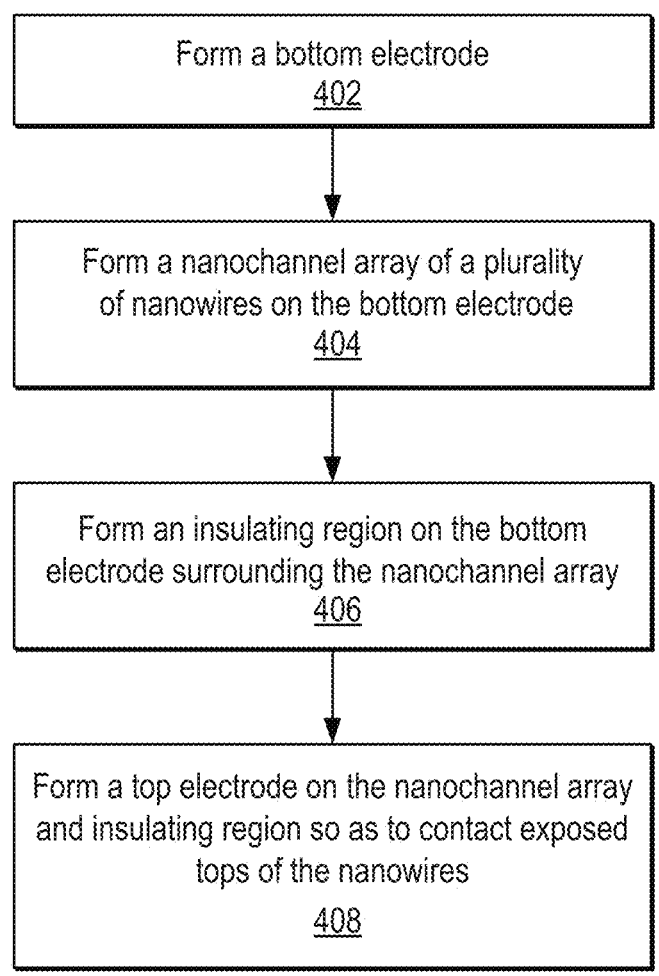
FIG. 4 is a flow chart depicting a method for making a memory device, such as a memristor, with nanochannels, according to an example.

The formation of the memristive device 100 with nanochannel arrays 108 is shown in FIG. 4 according to the example method 400. The bottom electrode 102 is first formed 402. The nanochannel array 108 of nanowires 110 is formed 404 on the bottom electrode 102. The insulating region, for example, insulating oxide, 106 is formed 406 on the bottom electrode 102 surrounding the nanochannel array 108. The top electrode 104 is formed 408 on the nanochannel array 108 and insulating region 106 so as to contact the tops of the nanowires 110 making up the nanochannel array. Each of the steps is described in greater detail below.

The bottom electrode 102 may be formed 402 on a substrate (not shown) by any of a number of processes, including electroplating, sputtering, evaporation, ALD, co-deposition, chemical vapor deposition, IBAD (ion beam assisted deposition), or any other film deposition technology. Examples of bottom electrode 102 materials include, but are not limited to, aluminum (Al), copper (Cu), platinum (Pt), tungsten (W), gold (Au), titanium (Ti), silver (Ag), ruthenium dioxide ($RuO_2$), titanium nitride (TiN), tungsten nitride ($WN_2$), tantalum (Ta), tantalum nitride (TaN) or the like. As another particular example, both the first electrode 102 and the second electrode 104 may be formed of doped silicon (Si). The electrodes 102 may be patterned, if desired. The thickness of the first electrode 102 may be in the range of about 10 nm to a few micrometers.

In some examples, the nanowires 110 making up the nanochannel array 108 may be formed 404 on the bottom electrode 102 by any of a number of processes such as vapor-liquid-solid (VLS) growth, with or without catalysts, such as gold nanoparticles deposited on the bottom electrode in the pattern desired for the nanowires making up the nanochannel array. In other examples, selective area growth (SAG) may be used. SAG may involve depositing the insulating oxide 106 on the bottom electrode 102, forming holes in the insulating oxide in the pattern desired for the nanowires 110 making up the nanochannel array 108, and filling the holes with the appropriate material to form the nanowires. In yet other examples, the nanowires 110 may be grown elsewhere and transferred to the surface of the bottom electrode 102.

The insulating oxide 106, whether deposited surrounding the nanowires 110 or used to establish the nanowires such as by SAG, may be formed 406 on the bottom electrode 102 by any of a number processes, such as ALD, sputtering, etc. The insulating oxide 106 may be formed to a thickness that is the same as the length of the nanowires 110. If one value exceeds the other, then thinning processes, such as chemical-mechanical polishing (CMP), may be used to bring the two values into approximate equality.

The top electrode 104 may be formed 408 on the nanochannel array 108 and insulating layer 106 by any of the processes listed above for the bottom electrode 102. Examples of top electrode 104 materials include, but are not limited to, the same as those listed above for the bottom electrode 102. The top electrode 104 material may or may not be the same as the bottom electrode 102 material. The thickness of the top electrode 104 may be in the range of about 10 nm to a few micrometers.

Figure 5:
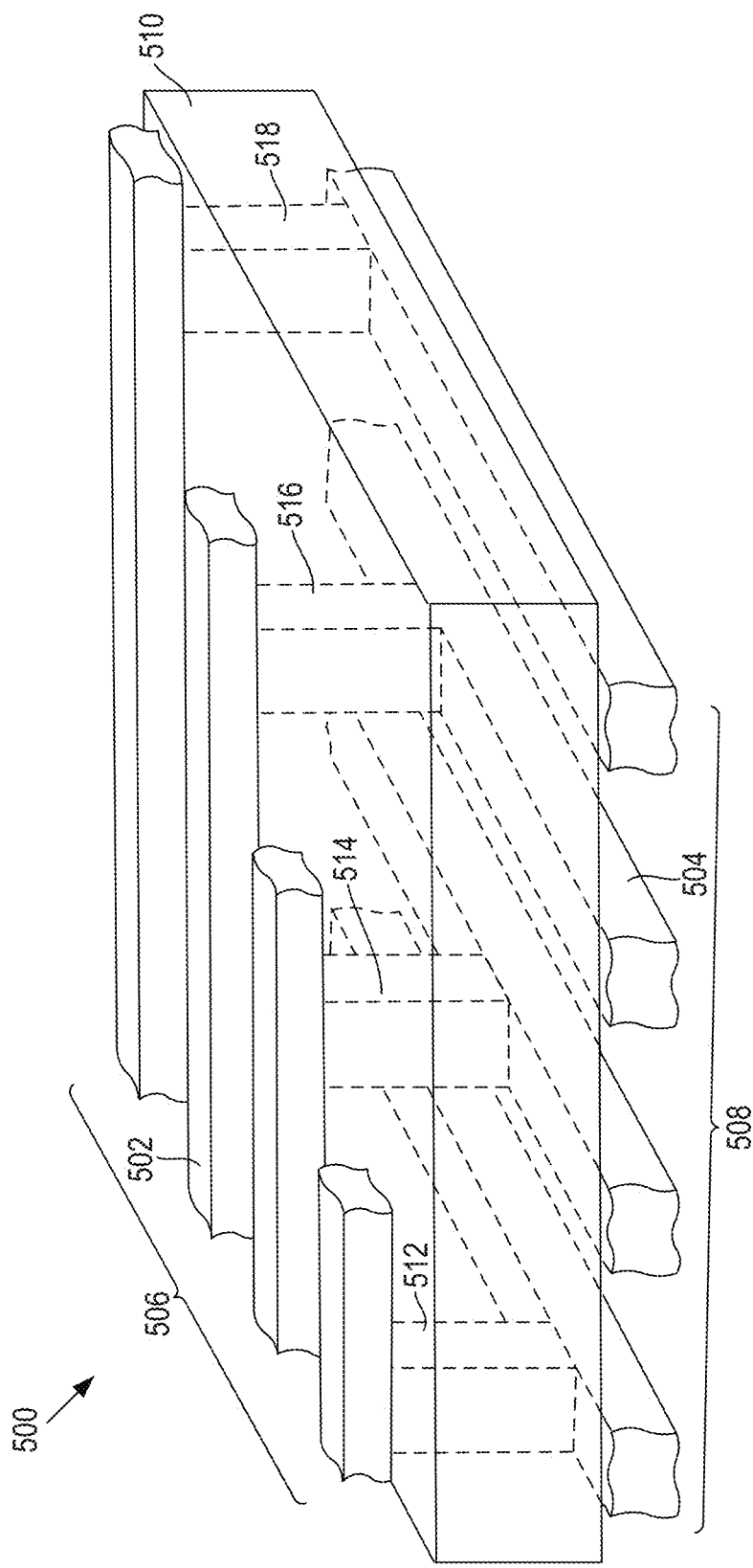
FIG. 5 is an isometric view of a nanowire crossbar architecture incorporating memory devices such as shown in FIG. 1, according to an example.

The resistive memory device 100 may be used in a memory array. FIG. 5 shows a perspective view of a nanowire memory array, or crossbar, 500, revealing an intermediate layer 510 disposed between a first layer of approximately parallel nanowires 508 and a second layer of approximately parallel nanowires 506. The first layer of nanowires may be at a non-zero angle relative to the second layer of nanowires.

According to one illustrative example, the intermediate layer 510 may be a dielectric layer. A number of the resistive memory devices 512-518 may be formed in the intermediate layer 510 at the intersections, or junctions, between nanowires 502 in the top layer 506 and nanowires 504 in the bottom layer 508. The nanowires may serve as the upper and lower electrodes 104, 102, respectively, in the resistive memory device 100. For example, when forming a resistive memory device similar to the example shown in FIG. 1, the wires in the top layer 506 could be formed from platinum, and the nanowires in the bottom layer 508 could be formed from platinum. The upper nanowires would then serve as the top electrode 104 and the lower nanowires would serve as the bottom electrode 102. In other examples, other conductive materials may be used as the upper and lower nanowires 502 and 504.

For purposes of illustration, only a few of the resistive memory devices 512-518 are shown in FIG. 5. Each of the combined devices 512-518 may be used to represent one or more bits of data. For example, in the simplest case, a resistive device may have two states: a conductive state and a nonconductive state. The conductive state may represent a binary "1" and the nonconductive state may represent a binary "0", or vice versa. Binary data may be written into the nanowire memory array 500 by changing the conductive state of the matrix within the resistive memory devices. The binary data can then be retrieved by sensing the conductive state of the resistive memory devices 512-518.

The example above is only one illustrative example of the nanowire memory array 500. A variety of other configurations may be used. For example, the memory array 500 may incorporate nonlinear elements that have different structures. The different structures could include more or less layers, layers that have different compositions than described above, and layers that are ordered in different ways than shown in the example given above. For example, the memory array may include memristors, memcapacitors, meminductors, or other memory elements. Further, the memory array may use a wide range of conductors to form the crossbars.

It should be understood that the resistive memory devices, and memristors, described herein, such as the example memristor depicted in FIG. 1, may include additional components and that some of the components described herein may be removed and/or modified without departing from the scope of the resistive memory device disclosed herein. It should also be understood that the components depicted in the Figures are not drawn to scale and thus, the components may have different relative sizes with respect to each other than as shown therein. For example, the upper, or second, electrode 104 may be arranged substantially perpendicularly to the lower, or first, electrode 102 or may be arranged at some other non-zero angle with respect to each other. As another example, the insulating region 106 may be relatively smaller or relatively larger than either or both electrode 102 and 104.

What is claimed is:

1. A resistive memory structure, comprising:
   two electrodes; and
   a resistive memory cell between the two electrodes, including:
      an insulating region; and
      a nanochannel array providing a conducting path between the two electrodes, the nanochannel array comprising a plurality of nanowires extending from one of the two electrodes to another of the two electrodes so as to directly contact the two electrodes.

2. The resistive memory structure of claim 1, wherein the resistive memory cell comprises a memristive cell.

3. The resistive memory structure of claim 1, wherein the nanowires comprise a material selected from the group consisting of metal oxides, metal nitrides, metal carbides, chalcogenides, and semiconductors.

4. The resistive memory structure of claim 3, wherein the nanowires comprise a material selected from the group consisting of transition metal oxides, transition metal nitrides, and transition metal carbides, the material supporting ionic conduction.

5. The resistive memory structure of claim 1, wherein the nanowires have a core/shell structure.

6. The resistive memory structure of claim 3, wherein the nanowires have a diameter ranging from about 0.1 to 2 nm.

7. The resistive memory structure of claim 1, wherein adjacent nanowires in the plurality of nanowires are contiguous.

8. The resistive memory structure of claim 3, wherein the nanochannel array comprises at least 10% of the resistive memory cell area.

9. The resistive memory structure of claim 1, wherein the insulating region is a transition metal oxide selected from the group consisting of tantalum oxide, titanium oxide, yttrium oxide, hafnium oxide, niobium oxide, and zirconium oxide, or a non-transition metal oxide selected from the group consisting of aluminum oxide, calcium oxide, magnesium oxide, dysprosium oxide, lanthanum oxide, and silicon dioxide, or a transition metal nitride selected from the group consisting of tantalum nitride and titanium nitride.

10. The resistive memory structure of claim 1, wherein the two electrodes are independently selected from the group consisting of aluminum, copper, platinum, tungsten, gold, titanium, silver, ruthenium dioxide, titanium nitride, tungsten nitride, tantalum, and tantalum nitride.

11. A crossbar comprising:
an array of approximately first nanowires and an array of approximately second nanowires, the array of first nanowires crossing the array of second nanowires at a non-zero angle, each intersection of a first nanowire with a second nanowire forming a junction: and
a resistive memory cell at each junction, sandwiched between a first nanowire and a second nanowire and comprising:
  an insulating region; and
  a nanochannel array providing a conducting path between the first nanowire and the second nanowire, the nanochannel array comprising a plurality of nanowires extending from the first nanowire to the second nanowire so as to directly contact the first nanowire and the second nanowire.

12. A method of manufacturing a resistive memory device, comprising:
forming a first electrode;
forming a resistive memory cell on the first electrode by:
  forming a nanochannel array on the first electrode, the nanochannel array comprising a plurality of nanowires; and
  forming an insulating region on the first electrode surrounding the nanochannel array; and
forming a second electrode on the nanochannel array and the insulating region so as to contact exposed tops of the nanowires, wherein the plurality of nanowires extend from the first electrode to the second electrode so as to directly contact the first electrode and the second electrode.

13. The method of claim 12, wherein the nanochannel array is formed first on the first electrode and the insulating region is deposited around the nanochannel array.

14. The method of claim 12, wherein the insulating region is deposited on the first electrode and the nanochannel array is formed in the insulating region.

15. The method of claim 12, wherein chemical-mechanical polishing is used to planarize the nanochannel array and insulating region so that the nanochannel array and the insulating region have approximately a same thickness.

16. The resistive memory structure of claim 1, wherein the conducting path between the two electrodes is located in interstitial regions between nanowires.

17. The resistive memory structure of claim 5, wherein the conducting path between the two electrodes is located in the core of the nanowires.

18. The resistive memory structure of claim 7, wherein the plurality of nanowires are arranged in a honeycomb configuration.

19. The resistive memory structure of claim 7, wherein the conducting path between the two electrodes is located on surfaces of the nanowires.

* * * * *